(12) United States Patent
Micovic et al.

(10) Patent No.: US 6,287,946 B1
(45) Date of Patent: Sep. 11, 2001

(54) FABRICATION OF LOW RESISTANCE, NON-ALLOYED, OHMIC CONTACTS TO INP USING NON-STOICHIOMETRIC INP LAYERS

(75) Inventors: Miroslav Micovic, Newbury Park; Daniel P. Docter, Santa Monica, both of CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/305,896

(22) Filed: May 5, 1999

(51) Int. Cl.[7] .......................... H01L 21/28; H01L 21/44; H01L 21/338

(52) U.S. Cl. .................... 438/571; 438/172; 438/167; 438/573

(58) Field of Search ................................ 438/570, 571, 438/572, 573, 575, 577, 580, 582, 167–186

(56) References Cited

U.S. PATENT DOCUMENTS

| | | |
|---|---|---|
| 4,662,060 | 5/1987 | Aina et al. . |
| 4,738,934 * | 4/1988 | Johnson, Jr. et al. ............... 438/508 |
| 5,102,812 | 4/1992 | Caneau et al. ...................... 438/316 |
| 5,319,223 | 6/1994 | Fujita et al. ......................... 257/190 |
| 5,358,878 * | 10/1994 | Suchet et al. ....................... 438/172 |
| 5,646,069 | 7/1997 | Jelloian et al. ..................... 438/605 |
| 5,656,515 | 8/1997 | Chandrasekhar et al. .......... 438/319 |
| 5,729,033 | 3/1998 | Hafizi ................................... 257/198 |

FOREIGN PATENT DOCUMENTS

| | | |
|---|---|---|
| 0301762 | 1/1989 | (EP) . |
| 60-11896 * | 6/1985 | (JP) . |

OTHER PUBLICATIONS

Jackson, Steven L., et al., "High–Efficiency Silicon Doping of InP and $In_{0.53}GA_{0.47}As$ in Gas Source and Metalorganic Molecular Beam Epitaxy Using Silicon Tetrabromide", *Appl. Phys. Lett.*, vol. 64, No. 21, May 23, 1994, pp. 2867–2869.

Patent Abstracts of Japan, No. 60032370, Feb. 19, 1985.

Docter, D.P., et al., "New results for nonstoichiometric InP grown by low temperature MBE," 10th Intern. Conf. on Indium Phosphide and Related Materials, (May 11–May 15, 1998), pp. 53–56.

Ng. T.B. et al., "Inhibited oxidation in low–temperature grown GaAs surface layers observed by photoelectron spectroscopy," *Applied Physics Letter* vol. 69, No. 23, (Dec. 2, 1996), pp. 3551–3553.

Patkar, M.P., et al., "Very low resistance nonalloyed ohmic contacts using low–temperature molecular beam epitaxy of GaAs," *Applied Physics Letter*, vol. 66, No. 11,(Mar. 13, 1995), pp. 1412–1414.

Wolf, S., "Contact Technology and Local Interconnects for VLSI," in: Wolf, S, *Silicon Processing for the VLSI Era* vol. II (Sunset Beach, California; Lattice Press, 1990) pp. 86–91.

Yamamoto, H., et al., "Nonalloyed ohmic contacts on low temperature molecular beam epitaxial GaAs:Influence of deep donor band," *Applied Physics Letter*, vol. 57, No.15, (Oct. 8, 1990), pp. 1537–1539.

* cited by examiner

*Primary Examiner*—Charles Bowers
*Assistant Examiner*—Thanhha Pham
(74) *Attorney, Agent, or Firm*—Ladas & Parry

(57) ABSTRACT

A method of reducing the specific contact resistivity of a metal to semiconductor interface between a metal contact and an InP semiconductor compound. The method includes the step of increasing the amount of the group V element (P) in the semiconductor compound so that the semiconductor compound is non-stoichiometric having an excess concentration of the group V element in an amount of at least 0.1% above stoichiometric levels.

9 Claims, 2 Drawing Sheets

FABRICATION OF LOW RESISTANCE, NON-ALLOYED, OHMIC CONTACTS TO INP USING NON-STOICHIOMETRIC INP LAYERS

U.S. GOVERNMENT RIGHTS

The U.S. Government has a paid-up license in this invention and the right in limited circumstances to require the patent owener to license others on reasonable terms as provided for by the terms of AFOSR Contract F49620-95-1-0394 awarded by the U.S. Department of Defense.

FIELD OF THE INVENTION

The present invention relates generally to metal ohmic contacts and, more particularly, to ohmic metal contacts with InP semiconductor compounds for use in various semiconductor devices and applications. The present invention also relates to methods of making ohmic metal contacts with InP semiconductor compounds.

DESCRIPTION OF THE RELATED ART

In the semiconductor arts, metal contacts to semiconductor materials within a semiconductor device are commonly used. Generally speaking, these contacts fall into two types, namely ohmic contacts and rectifying contacts (also referred to as Schottky contacts). Ohmic contacts are the type of contact normally fabricated for the purpose of interconnecting devices in a semiconductor integrated circuit although non-ohmic contacts do have certain uses.

In general, when a metal to semiconductor contact is fabricated, it can either provide an ohmic contact (which means that a near linear current-voltage characteristic occurs for both directions of current flow through the contact) or the contact can be rectifying (which means that the current-voltage characteristic is decidedly non-linear as the direction of current flow reverses).

In the prior art, metal to semiconductor contacts are normally made in one of two ways. One way is to heavily dope the semiconductor material immediately adjacent the metal contact. The other technique which is commonly used is referred to as "alloying". When the metal is alloyed at a predetermined temperature and for a predetermined period of time, the metal, which usually deposited on the semiconductor, penetrates into the semiconductor material. The amount of penetration of the metal into the semiconductor material generally increases with increased temperature and/or increased time.

Semiconductor materials in the prior art can either be crystalline or non-crystalline. Semiconductor devices, such as Heterostructure Field Effect Transistors (HFET), Heterojunction Bipolar Transistors (HBT), High Electron Mobility Transistors (HEMT), semiconductor light emitting diodes, semiconductor light detectors and diodes et cetera are often formed of crystalline layers of semiconductor compounds of the III–V groups. As such, one or more of the layers may comprise Indium Phosphide (InP) or an InP semiconductor compound. With respect to the devices noted above, they usually comprise a number of semiconductor layers and each layer tends to be grown upon a preceding layer. In order for crystal growth to proceed properly, it is very desirable that each layer comprise a single crystalline structure so that the following layers enjoys that same characteristic. Such crystalline layers are often referred to as being epitaxial. Generally speaking, it is desirable to minimize the amount of heating which such devices are subjected to during device manufacture.

Those skilled in the art will appreciate, of course, that sometimes a layer comprising many different crystals, which layer is then referred to as being poly-crystalline, can also be utilized.

Generally speaking, the efficiency of an ohmic contact (i.e., the amount of resistance which occurs at a metal semiconductor interface) is referred to as its specific contact resistivity. Values of specific contact resistivity acceptable in the manufacture of Integrated Circuits (ICs) typically fall in the range of $5 \times 10^{-6}$ to $10^{-8}$ $\Omega$-cm$^2$.

SUMMARY OF THE INVENTION

The present invention relates to the formation of non-alloyed metal ohmic contact to InP. InP is a semiconductor compound of the III–V group which is commonly used in a wide range of modern semiconductor devices such as the so-called High Electron Mobility Transistor (HEMT) and the so-called Heterojunction Bipolar Transistor (HBT) devices. Specific contact resistivities below $5 \times 10^{-6}$ $\Omega$-cm$^2$ have been measured for non-alloyed Ti/Pt/Au/contacts deposited on undoped non-stoichiometric InP layers. The formation of non-stoichiometric InP layers is described in a paper entitled "New Results for Non-Stoichiometric InP Grown by Low Temperature MBE" delivered by one of the inventors hereof at the 10th International Conference on Indium Phosphide and Related Materials May 11–15, 1998 Tsukuba, Japan. The aforementioned paper is hereby incorporated herein by reference.

The present invention permits the fabrication of non-alloyed ohmic metal contacts to InP semiconductor compounds without the use of heavy doping levels, which levels are defined as being doping levels above $10^{19}$ cm$^{-3}$, of shallow impurities.

It is believed that the present invention may also be used to further reduce the specific contact resistance of ohmic contacts made to heavily doped InP.

The HEMT and HBT devices noted above may use InP collector and/or emitter layers (and possibly other layers as well) which can benefit from reliable ohmic contacts without the need to rely on alloy and/or heavy doping to achieve an ohmic contact.

Molecular Beam Epitaxy (MBE) can be used to grow layers of materials of the III–V compound semiconductor group. Indeed, the compound produced can be non-stoichiometric through the incorporation of excess amounts of the group V element. As has been demonstrated in the paper entitled "New Results for Non-Stoichiometric InP Growth by Low Temperature MBE" referred to above, non-stoichiometric InP layers remain crystalline when they contain 0.6% excess phosphorous. The results also showed that the substrate temperatures at which good crystalline layers of non-stoichiometric InP can be grown is relatively narrow, between 260° C. and 340° C.

Low resistance, non-alloyed ohmic contacts can be fabricated on undoped non-stoichiometric InP films which contain 0.6% excess phosphorous. It is believed that the percentage of excess phosphorous is not particularly critical and it is believed that non-stoichiometric InP films which contain as little as 0.1% excess phosphorous can also likely produce low resistance non-alloyed ohmic contacts. The upper limit of the amount of phosphorous which may be used in the non-stoichiometric InP film is not known, although it is known that when the InP film contains approximately 2% excess phosphorous, the InP film becomes poly-crystalline (the phosphorous starts to precipitate out at that concentration). Since many applications require the use of crystalline InP films, the point at which the excess phosphorous causes the film to become poly-crystalline by precipitation acts as a practical upper limit for the amount of excess phosphorous which may be utilized in such applications. However, certain applications can utilize poly-crystalline InP films and therefore the amount of excess phosphorous can be higher than 2% and it is believed that the amount of excess phosphorous can be as least as high as 11% as reported in the aforementioned paper.

The group III–V semiconductor compounds are often grown in epitaxial layers using MBE. The lattice constants of the layers should either be matched or at least approximately matched or the layers should be sufficiently thin to that they will deform to accommodate the lattice constant of the underlying layer. Devices with such thin, deformed layers are often called "pseudomorphic." Pseudomorphic layers, while thermodynamically stable for layer thicknesses below some strain-dependant level, can relax due the formation of arrays of misfit dislocations of the otherwise crystalline layer structure if subjected to undue heating in subsequent processing steps. As such, it is often desirable to limit the heating of devices made of epitaxial layers, especially when the layers are pseudomorphic. This invention helps reduce and/or eliminate heating which might be otherwise employed to achieve a metal to semiconductor ohmic contact with InP semiconductor compounds.

DETAILED DESCRIPTION OF THE INVENTION

Experimental data demonstrates that low resistance non-alloyed ohmic contacts can be fabricated on undoped non-stoichiometric InP films which contain 0.6% of excess phosphorous. Non-stoichiometric InP films of 0.8 μm thickness were grown by known MBE techniques. The contact resistance was measured by transmission line method. The transmission lines used in the experiment were 13 μm wide. The spacing between the contact pads was 2 μm, 4 μm, 8 μm, 16 μm and 32 μm. Contact pads were defined by a lift-off process and metals were deposited by electron beam evaporation. The transmission lines were isolated by wet chemical etching of mesa structures by a 3:1 $H_3PO_4$:HCl etching solution. The measured specific contact resistivity of the as-deposited Ti/Pt/Au contacts was $9 \times 10^{-6}$ $\Omega$-$cm^2$. The specific contact resistivity was reduced to $5 \times 10^{-6}$ $\Omega$-$cm^2$ following a 20 second anneal at 360° C. These values of specific contact resistivity are remarkably low considering the relatively low electron concentration which occurs in non-stoichiometric InP films. Experimental data indicate the potential of the described technique and suggests that contact resistivity may be additionally improved by intentionally doping non-stoichiometric InP layers or by the fabrication of a composite contact layer structure (see FIG. 3) comprising a thin layer or film of non-stoichiometric InP 0.5 nm to 20 nm thick grown on a heavily doped layer (or superlattice, if appropriate) of InGaAs, InP or InGaAsSb. The measured contact resistance of AuGe/Ni/Au contacts was comparable to resistance of Ti/Pt/Au contacts, and was not improved by the aforementioned annealing step.

Figure 1:
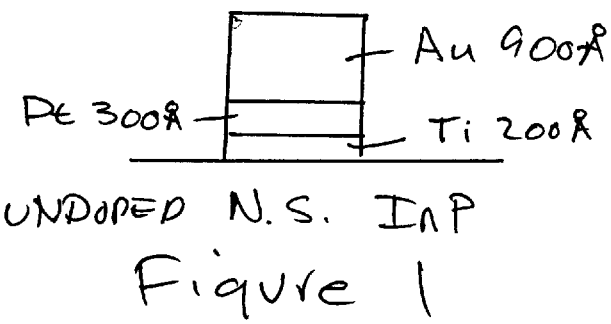
FIG. 1 depicts a Ti/Pt/Au metal system on a non-stoichiometric (NS) InP layer.

FIG. 1 depicts a Ti/Pt/Au metal system on a non-stoichiometric (NS) InP contact layer. As indicated in FIG. 1, the preferred thickness of the Ti layer is 200 Å, the Pt layer is 300 Å while the Au layer is 900 Å. Preferably, the NS InP layer has at least 0.1% excess phosphorous.

Figure 2:
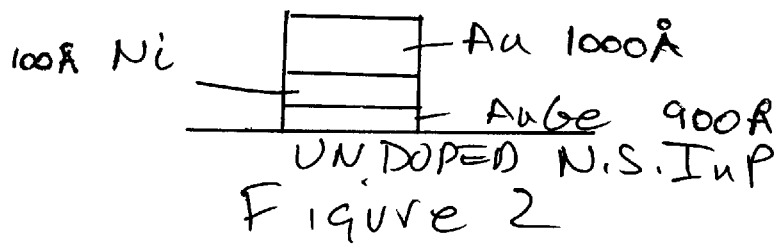
FIG. 2 shows an AuGe/Ni/Au metal contact system on a non-stoichiometric (NS) InP layer.

FIG. 2 shows an AuGe/Ni/Au metal contact system on an NS InP layer. As indicated in FIG. 2, the preferred thickness of the AuGe layer is 900 Å, the Ni layer is 100 Å while the Au layer is 1000 Å. Preferably, the NS InP layer has at least 0.1% excess phosphorous. In order to help prevent intermixing of Ge in the InP layer, an isolation layer of, for example Ni of about 100 Å thickness may be interposed between the InP and the AuGe layer.

Figure 3:
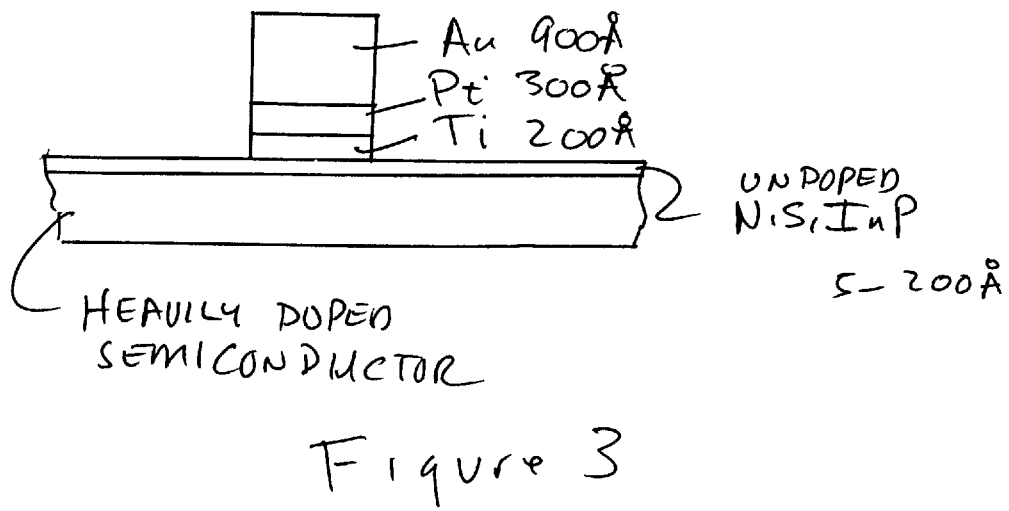
FIG. 3 shows an Ti/Pt/Au metal contact on a composite contact layer comprising a thin non-stoichiometric InP layer grown on a heavily doped semiconductor.

FIG. 3 shows a Ti/Pt/Au metal contact on a thin non-stoichiometric (NS) InP contact layer. The thicknesses of the metal layers are preferably as previously described with reference to FIG. 1. Preferably, the NS InP contact layer has at least 0.1% excess phosphorous. The NS InP contact layer is grown on a layer of heavily doped InP, InAlAs, InGaAs, InGaAsSb, InAlAsSb, or AlGaPSb bulk or superlattice layer. The combination of the thin NS InP layer and the underlying doped layer/superlattice provides a composite contact layer providing excellent metal contact properties in terms of reduced specific contact resistivity compared with undoped stoichiometric InP. The InP contact layer is preferably 0.5 nm to 20 nm thick.

Figure 4:
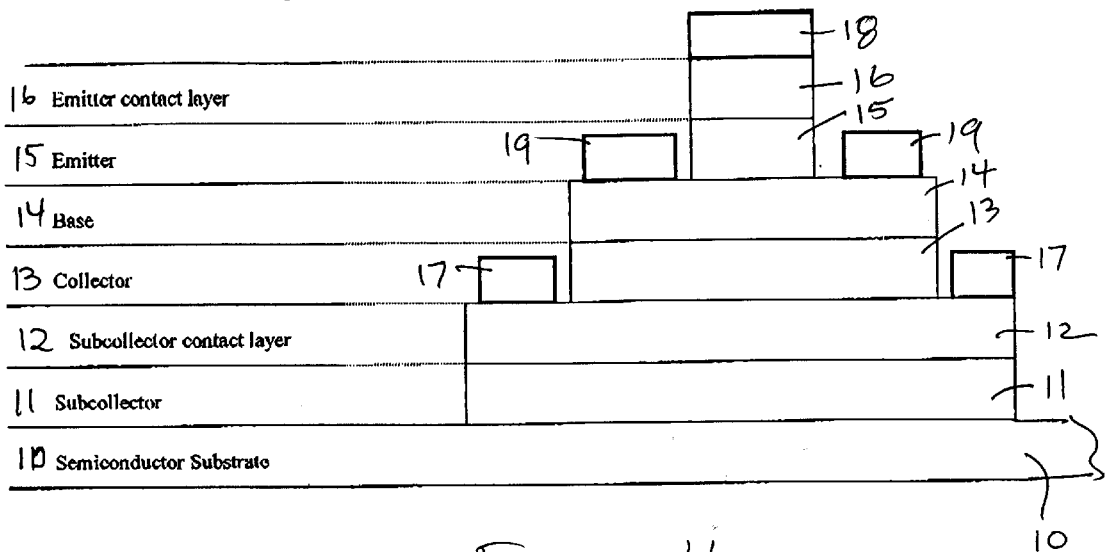
FIG. 4 shows a practical application for the instant invention in terms of an HBT device.

FIG. 4 shows a practical application for the instant invention in terms of an HBT device. On the left hand side of FIG. 4 is shown the HBT structure in terms of layers of semiconductor compounds of the III–V group prior to the utilization of appropriate masking and etching techniques to form an HBT device which is shown on the right hand side of FIG. 4. The layers include (from the bottom up):

(i) an undoped InP semi-insulating substrate 10;

(ii) a subcollector layer 11 formed of doped InP, doped InGaAs, or a doped InGaAsSb layer or superlattice;

(iii) a subcollector contact layer 12 preferably formed of a contact layer of the type shown in FIGS. 1, 2, or 3 or alternatively formed of a heavily doped InP, InGaAs, or InGaAsSb layers or superlattice structures;

(iv) a collector layer 13 formed of doped InGaAs, doped InP or doped AnAlAs;

(v) a base layer 14 formed of heavily doped InGaAs or a heavily doped InGaAsSb layer or superlattice with the doping in the base layer 14 being of of an opposite conductivity type to the doping used for layers (or superlattices) 11, 12, 13, 15 and 16;

(vi) an emitter layer 15 formed of doped InP, doped InAlAs or a doped InGaAsSb layer or superlattice; and (vii) an emitter contact layer 16 preferably formed of a contact layer of the type shown in FIGS. 1, 2, or 3 or alternatively formed of heavily doped InP, heavily doped InGaAs, or a heavily doped InGaAsSb layer or superlattice.

Any one of the NS InP contact layers shown in FIGS. 1–3 can be used for subcollector contact layer 12 and either of the NS InP contact layers shown in FIGS. 1 and 3 can be used for emitter contact layer 16.

After appropriate masking and etching and the deposition of metal contacts, the structure shown on the right hand side of FIG. 4 can be obtained using well known masking, etching, and deposition processes. At least one metal collector contact 17 on the subcollector contact layer 12 and a metal emitter contact 18 on the emitter contact layer 16 provides an ohmic contact (i) without the need to anneal the metal into the underlying InP layer (if used) or at least with less damaging anneal requirements compared to stoichiometric InP and (ii) without necessarily providing a shallow region of contact doping immediately adjacent the metal contact. Metal contacts 17 and 18 for the subcollector and emitter contact layers, respectively, are formed on layers 12 and 16, respectively, using known deposition techniques. One or more metal contacts 19, preferably of a Ti/Pt/Au structure, are formed on the base layer 14. Due to doping of the base layer 14, the metal contacts 19 formed the base layer also are ohmic. The metal contacts 17 and 18 when formed on an underlying NS InP layer are also ohmic provided the NS InP layer(s) have an excess concentration of phosphorous of at least 0.1% excess phosphorous in accordance with the teachings of this invention.

Figure 5:
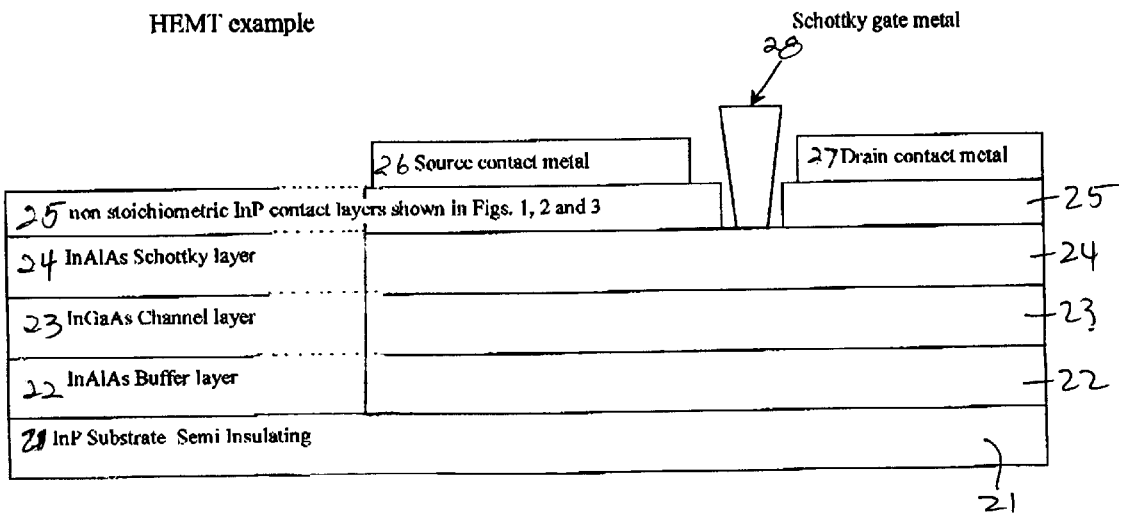
FIG. 5 shows a practical application for the instant invention in terms of an HEMT device.

FIG. 5 shows a layered structure on the left hand side thereof and a HEMT device on the right hand side thereof which may be formed therefrom. This device includes an InP substrate 21 doped with silicon. Upon that is formed an InAlAs buffer layer 22, an InGaAs channel layer 23, an InAlAs Schottky layer 24 and a non-stoichiometric (NS) InP contact layer 25.

After a suitable etching and the deposition of source, drain and gate areas, the field effect transistor structure shown on the right hand side of FIG. 5 may be obtained. Source contact 26 and drain contact 27 of the device are formed the non-stoichiometric InP layer 25 which preferably has at least 0.1% excess phosphorous. Since the NS InP layer shown in FIG. 5 does not have any other semiconductor crystalline layers grown thereon, that layer does not necessarily have to be crystalline. It may be poly-crystalline and therefore the amount of excess phosphorous in the NS InP layer may be as high as 11% (and perhaps higher). However, those skilled in the art will appreciate, of course, that if it is desired that the NS InP layer be crystalline, then the amount of excess phosphorous in the NS InP layer will likely fall in the range of 0.1% to 2% excess phosphorous in order to maintain layer 25 epitaxial. The contacts 26 and 27 are preferably formed in accordance with the contact structures shown in FIGS. 1, 2 or 3. Thus, the underlying NS InP layer may be disposed directly on the Schottky layer 11 or it may be formed on a intermediate layer, such as that shown by FIG. 3. The gate contact 28 is preferably a Ti/Pt/Au contact.

Two different metal contact systems are shown in FIGS. 1 and 2 and it is believed that other metal systems can also be used with excellent results. Additionally, practical applications for using the present invention in terms of a buries NS InP layer in an HBT structure (FIG. 4) and a top InP layer in an HEMT field effect transistor device (FIG. 5).

As noted above, in some cases modest improvement in the specific contact resistivity can be obtained if the device is subjected to an anneal after laying down the metal contact.

Additionally, while acceptable levels of specific contact resistivity can be obtained between a metal and a highly doped semiconductor layer, even better (i.e. lower) specific contact resistivities are obtained between metals and InP semiconductor compounds of the III–V group having excess (non-stoichiometric) amounts of the group V element.

Having described the invention in connection with a preferred embodiment thereof, modification will now doubtlessly suggest itself to those skilled in the art. For example, the semiconductor layers can implemented as superlattice structures, if desired. Also, the invention has been disclosed in terms of InP as the semiconductor compound. Some skilled in the art may prefer to practice the invention with other InP semiconductor compounds such as InGaP, InAlP, InGaAsP and the like. Additionally, while the invention has been disclosed in terms of possible applications to HBTs and HEMTs, those skilled in the art that there are many possible applications in which the ability to form ohmic contacts to InP semiconductor compounds can be very important. Specifically, the present invention can be used where the capability to form ohmic contacts to InP semiconductor compounds in devices which are preferably manufactured at relatively low temperatures is important. Such devices can include, for example, light emitting materials used in various applications, including flat panel display technology. As such, the invention is not to be limited to the disclosed embodiments except as required by the appended claims.

What is claimed is:

1. A method of reducing the specific contact resistivity of a metal to semiconductor interface between a metal contact and an InP semiconductor compound, the method including the step of increasing an amount of the group V element in the InP semiconductor compound so that the InP semiconductor compound is non-stoichiometric having an excess concentration of the group V element in an amount of at least 0.1% above stoichiometric levels.

2. The method of claim 1, wherein the InP semiconductor compound is InP and wherein the P constituent of the InP compound falls in the range of 0.1 to 11% excess P above stoichiometric levels.

3. The method of claim 2, wherein the InP semiconductor compound is crystalline and wherein the InP semiconductor compound contains in the range of 0.6 to 2% excess phosphorous.

4. The method of claim 3, wherein the InP semiconductor compound contains approximately 0.6% excess phosphorous.

5. The method of claim 1, wherein the InP semiconductor compound is substantially free of a dopant.

6. The method of claim 1, wherein the metal contact comprises a layer of Titanium immediately adjacent the InP semiconductor compound, a layer of Platinum on the Titanium layer and a layer of Gold on the Platinum layer.

7. The method of claim 1, wherein the metal contact comprises a layer of a Gold Germanium alloy immediately adjacent the InP semiconductor compound, a layer of Nickel on the Gold Germanium alloy layer and a layer of Gold on the Nickel layer.

8. The method of claim 1 wherein the InP semiconductor compound is InP.

9. The method of claim 1 wherein the InP semiconductor compound is selected from the group consisting of InGaP, InAlP, and InGaAsP.

* * * * *